US010942329B1

(12) United States Patent
Lee et al.

(10) Patent No.: US 10,942,329 B1
(45) Date of Patent: Mar. 9, 2021

(54) OPTICAL MODULE STRUCTURE

(71) Applicant: TAIWAN SEMICONDUCTOR MANUFACTURING COMPANY LTD., Hsinchu (TW)

(72) Inventors: Yung-Yao Lee, Hsinchu County (TW); Ho-Ping Chen, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 16/579,020

(22) Filed: Sep. 23, 2019

(51) Int. Cl.
*G03F 7/20* (2006.01)
*G02B 7/02* (2006.01)
*G02B 9/62* (2006.01)

(52) U.S. Cl.
CPC ........... *G02B 7/021* (2013.01); *G03F 7/7015* (2013.01); *G03F 7/70025* (2013.01); *G02B 9/62* (2013.01)

(58) Field of Classification Search
CPC ..... G03F 7/021; G03F 7/70025; G03F 7/7015
USPC .............................. 355/53, 67; 359/811–820
See application file for complete search history.

(56) References Cited

U.S. PATENT DOCUMENTS

| | | | | |
|---|---|---|---|---|
| 4,723,833 | A * | 2/1988 | Yamada | G02B 7/025 359/820 |
| 2003/0179469 | A1* | 9/2003 | Maeda | G11B 7/1372 359/719 |
| 2011/0075021 | A1* | 3/2011 | Chang | G02B 7/022 348/374 |
| 2015/0226933 | A1* | 8/2015 | Sugita | G02B 7/028 359/829 |
| 2018/0216811 | A1* | 8/2018 | Fukakusa | F21V 13/08 |

* cited by examiner

*Primary Examiner* — Hung Nguyen
(74) *Attorney, Agent, or Firm* — WPAT, P.C., Intellectual Property Attorneys; Anthony King

(57) ABSTRACT

An optical module structure is provided. The optical module structure includes a holder, an elastic damper layer, and an optical component. The holder has an inner surface; the elastic damper layer is on the inner surface and has a trench at a first surface of the elastic damper layer; and the optical component is engaged with the elastic damper layer through the trench. Also, an optical system is provided. The optical system includes a light source, an, and a reflector, wherein a plurality of optical components in the optical module are arranged along a direction perpendicular to a direction of gravity.

20 Claims, 8 Drawing Sheets

10
302
104
106
108
202
204
20
C
102
30
G
1
A
B
302

OPTICAL MODULE STRUCTURE

FIELD

The present disclosure is related to an optical module structure and, more particularly, to an optical module structure that the weight of the optical components thereof is borne by a tubular holder.

BACKGROUND

High resolution and high overlay accuracy have been required for semiconductor process. For instance, the fabrication of integrated circuits generally requires the formation of multiple integrated circuit structures on a wafer or on one or more layers over the wafer. These structures are frequently formed through a photolithography process, which may include a reticle through which ultraviolet light is transmitted to the wafer. The reticle blocks the light in areas of the wafer to remain unetched, and permits light to pass through areas to be etched.

Photolithography processes may further require metrology steps to ensure proper sizing and alignment of structures within a layer or between layers. Metrology may not only be required to measure alignments on the wafer but also on the reticle. Generally, reticle metrology may be carried out separately from wafer metrology. The step and repeat alignment and exposure system is thus developed for achieving high resolution, high overlay accuracy and enhancement of the product yield.

BRIEF DESCRIPTION OF THE DRAWINGS

Aspects of the present disclosure are best understood from the following detailed description when read with the accompanying figures. It is noted that, in accordance with the standard practice in the industry, various structures are not drawn to scale. In fact, the dimensions of the various structures may be arbitrarily increased or reduced for clarity of discussion.

DETAILED DESCRIPTION

Figure 1A:
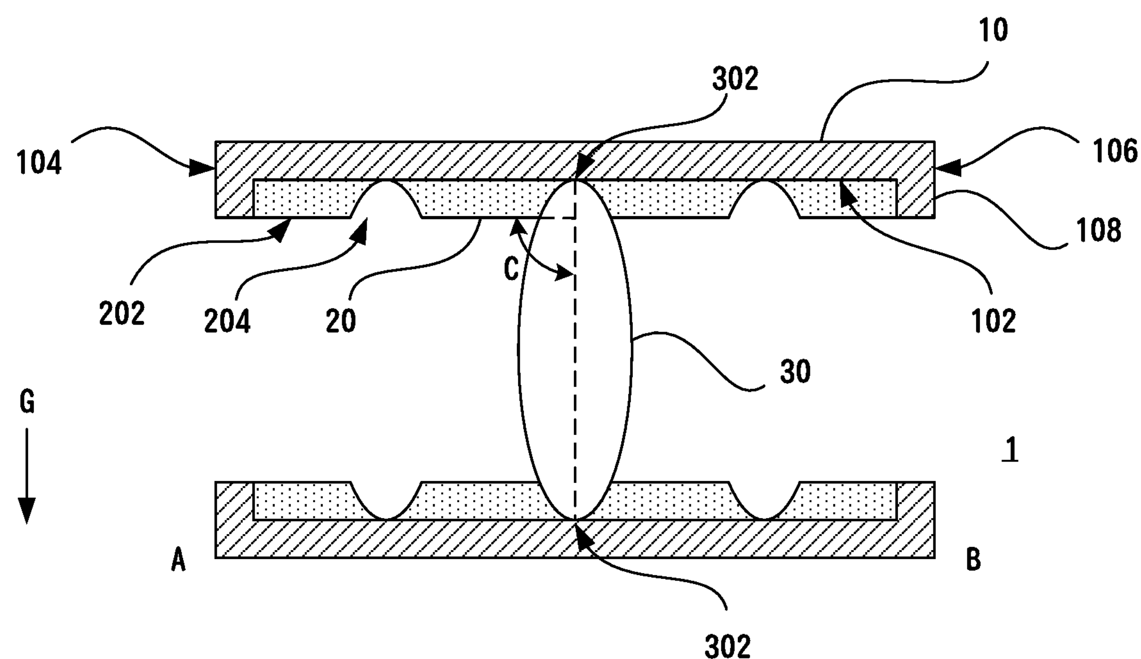
FIG. 1A illustrates a cross-sectional view of an optical module structure according to some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper", "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the terms such as "first", "second" and "third" describe various elements, components, regions, layers and/or sections, these elements, components, regions, layers and/or sections should not be limited by these terms. These terms may be only used to distinguish one element, component, region, layer or section from another. The terms such as "first", "second", and "third" when used herein do not imply a sequence or order unless clearly indicated by the context.

The manufacture of integrated circuit devices involves repeated sequences of the steps of deposition, photolithographic patterning, and etching. During the step of deposition, a layer of conductive or insulating material is deposited on the surface of a semiconductor wafer. This material is then coated with a photosensitive resist. During the step of photolithographic patterning, which includes a set of optical and chemical processes, images of some desired geometric patterns residing on a reticle are transferred onto the photo resist. The semiconductor wafer is then developed and etched to remove material from the areas exposed to light, corresponding to clear areas in the reticle images.

The primary tool used for projecting a circuit image from a reticle onto a resist-coated wafer is the wafer stepper. That is, step and repeat alignment and exposure systems are employed in the processing of semiconductor wafers to form integrated circuits. Generally, large scale integrated circuits are often fabricated by utilizing a precisely controlled stage to successively position adjacent regions containing an integral number of individual microcircuits on a semiconductor wafer with respect to an image of a reticle containing a next level of micro circuitry, wherein the image is formed by projection lenses of the step and repeat alignment and exposure system.

This step and repeat printing operation forms an array of adjacent regions of micro circuitry on the semiconductor wafer in rows and columns in an ordered parallel and orthogonal manner. Successive processing of the semiconductor wafer and printing of a further level of micro circuitry, aligned with the preceding processed regions to a high accuracy, are typically employed in the fabrication of integrated circuits from the semiconductor wafer. Successful alignment of the preceding processed regions requires the use of an alignment system that can acquire alignment information from the semiconductor wafer and use it to position the precisely controlled stage so that the semiconductor wafer is properly aligned.

However, the alignment light source may be drifted to an incorrect position due to optics displacement in some circumstances. Such instability of the alignment system would cause poor overlay accuracy, which may induce the electrical property of the semiconductor wafer become poor. The optical components in the conventional optical modules in the alignment system cannot be screw-fixed because the freedom of movement granted by the screw to the optical components is too high so that the optical components may displace due to the vibration of the optical modules under operation. Alternatively, the optical components in the conventional optical modules were fixed by adhesive at the edge thereof, thereby the weight of the optical components are borne by the adhesive and receive less freedom of movement than the screw. Those optical components still may displace from the original positions due to the aging of adhesive and thermal issues.

For example, in a conventional optical module, glue may be spread on an inner surface of a shell of the optical module in order to position the optical components inside. The optical components are supported by the glue. However, the glue may not bear the weight of the optical components, particularly, the adhesion property of the glue may decline during the alignment process due to the process temperature. As a result, the glue itself may not only have aging issue but also the optical component may have thermal expansion or contraction issues, which all may cause the optical components to become unbalanced or displaced in the optical module, or even dropped from the original position.

Accordingly, the present disclosure provide an optical module structure that the optical component may be supported and positioned in the optical module stably, thus the overlay accuracy may be enhanced and the yield of the integrated circuit devices may be improved.

Referring to FIG. 1A, an optical module structure 1 is provided. The optical module structure 1 includes a holder 10, an elastic damper layer 20, and an optical component 30. The holder 10 has an inner surface 102. The elastic damper layer 20 is disposed on the inner surface 102. In some embodiments, the elastic damper layer 20 has at least a trench 204 at a first surface 202 of the elastic damper layer 20.

Figure 1B:
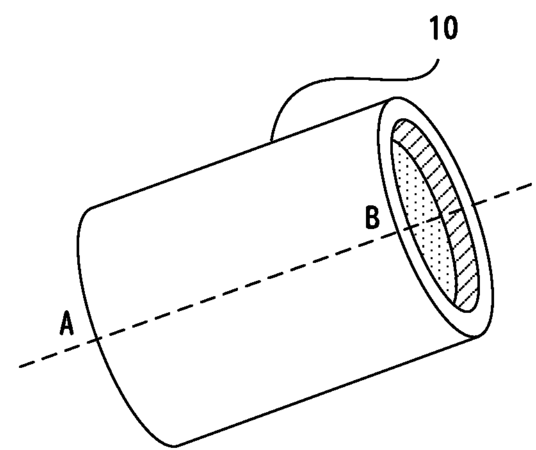
FIG. 1B illustrates an optical module structure according to some embodiments of the present disclosure.

Referring to FIGS. 1A and 1B, FIG. 1A is a cross-sectional view of 1B along line AB, and the holder 10 can be a hollow tube and may hold the objects inside such as optical components 30. In some embodiments, the holder 10 has a tubular structure with an inlet end 104 and an outlet end 106. In some embodiments, the holder 10 has a round cross section, an elliptical cross section, or a rounded rectangle cross section in geometry for fitting the structures of the objects inside.

In some embodiments, the optical component 30 is disposed in the holder 10 and thus be supported by the holder 10. That is, the weight of the optical component 30 is borne by the holder 10. More precisely, in the present disclosure, the usage of the optical module structure 1 is in a direction that the inlet end 104 and the outlet end 106 of the holder 10 are set horizontally. Meanwhile, the optical component 30 is erected on the inner surface 102 (i.e., the angle C between the inner surface 102 and the optical component 30 is about 90° in FIG. 1A) and a radial direction of the optical component 30 is parallel to a direction of gravity G as shown in FIG. 1A.

In order to apply the weight of the optical component 30 to the holder 10, in some embodiments, the optical component 30 is in contact with the inner surface 102 of the holder 10. In some embodiments, an end point 302 of the optical component 30 may in contact with the inner surface 102, wherein the end point 302 belongs to a plain surface or a curved surface at an edge of the optical component 30.

In some embodiments, the optical component 30 is positioned by the elastic damper layer 20. Still referring to FIG. 1A, the optical component 30 is engaged with the elastic damper layer 20 through the trench 204. In the present disclosure, the optical component 30 is not positioned on the holder 10 through adhesives, instead, in some embodiments, the elastic damper layer 20 is made of an vibration absorption material so that the elastic damper layer 20 may absorb the shocks or the vibrations delivered to the optical component 30 and the holder 10, therefore the displacement of the optical component 30 may be avoided.

In some embodiments, the vibration absorption material may be rubber and the like, including natural rubber and synthetic rubber. For instance, such vibration absorption material may be isobutylene isoprene rubber (IIR), thermoplastic rubber (TPR), ethylene propylene diene monomer (EPDM), chloroprene rubber (CR), hydrogenated nitrile rubber (NHBR) carboxylate nitrile rubber (XNBR), silicone rubber or high consistency rubber (HCR). In some embodiments, some of the polymers with vibration absorption ability are also available, for example, polyurethane (PU) or thermoplastic polyurethane (TPU) are selectable material in making the elastic damper layer 20.

The optical component 30 may be a lens, an optical filter, and the like. The type of the lens may be various. For instance, the optical component 30 may be a biconvex lens, a plano-convex lens, a positive meniscus lens, a negative meniscus lens, a plano-concave lens, a biconcave lens, or a combination thereof in the case of the optical module structure includes multiple optical components 30. In some embodiments, the optical component 30 may be a mask with at least a slit or aperture for optical diffraction or interference usage. In some embodiments, the optical component 30 is a lens or an optical filter which include a frame.

Figure 2:
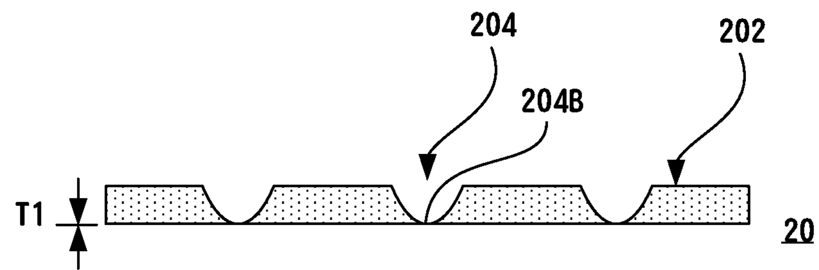
FIG. 2 illustrates a cross-sectional view of an elastic damper layer according to some embodiments of the present disclosure.

The end point 302 of the optical component 30 may be in contact with the inner surface 102. Accordingly, in some embodiments, referring to FIG. 2, the thickness T1 of the elastic damper layer 20 at a bottom 204B of the trench 204 is about zero. Under such configuration, the weight of the optical component 30 previously shown FIG. 1A may be directly borne by the holder 10. In some embodiments, the elastic damper layer 20 is spaced between the optical component 30 and the inner surface 102 of the holder 10 at the bottom 204B of the trench 204, as will be discussed in FIG. 3.

Through the contact between the optical component 30 and the inner surface 102, the weight of the optical component 30 may not be borne by the elastic damper layer 20, therefore the compression of the elastic damper layer 20 may be avoided. Particularly, in the case of an optical module structure that includes multiple optical components 30, the different weights between different optical components 30 may induce different extents of compression to the elastic damper layer 20, which may affect the alignment of the optical module structure. More precisely, the heavier the optical component 30, the greater load bearing on the elastic damper layer 20. As a result, an optical center of the optical component 30 may deviate from a central axis of the holder 10.

Figure 3:
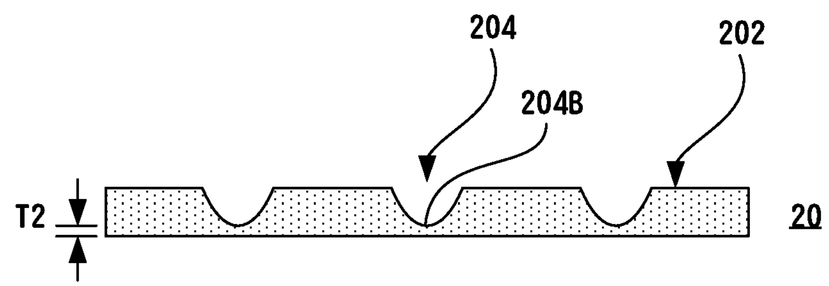
FIG. 3 illustrates a cross-sectional view of an elastic damper layer according to some embodiments of the present disclosure.

Referring to FIG. 3, in some other embodiments, the thickness T2 of the elastic damper layer 20 at a bottom 204B of the trench 204 is larger than zero, which means the optical component 30 may be spaced from the inner surface 102 of the holder 10 by the elastic damper layer 20. Under this configuration, the weight of the optical component 30 may be indirectly borne by the holder 10. In such embodiments, the bearing loads may be applied to the elastic damper layer 20, and while the optical component 30 is engaged with the elastic damper layer 20 through the trench 204, the thickness of the bottom 204B of the trench 204 may slightly decrease due to compression. In the case of an optical module structure 1 includes multiple optical components 30, such thickness decrease may be neglected if the weights of the optical components 30 are substantially the same.

Figure 4:
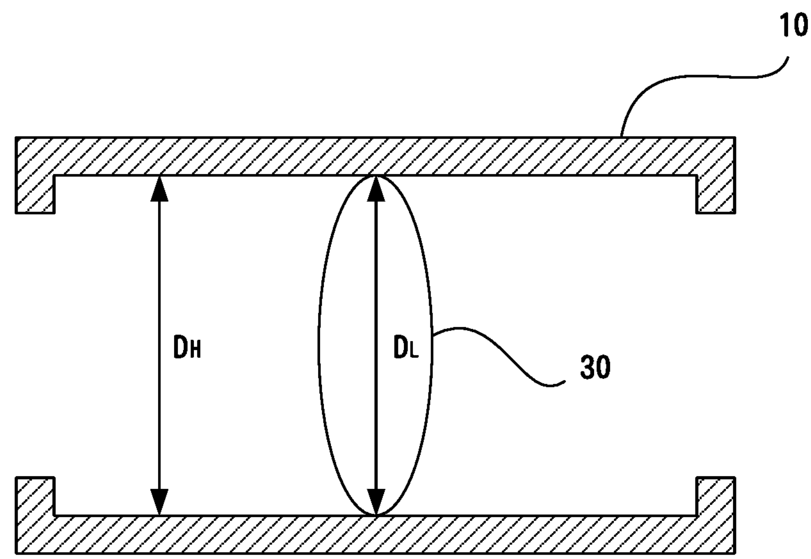
FIG. 4 illustrates a cross-sectional view of a holder and an optical component according to some embodiments of the present disclosure.

Referring to FIG. 4, in some embodiments, the holder 10 has a tubular structure so that the optical components 30 may in contact with the inner surface 102 at a plurality of points or at a circumference thereof. In some embodiments, the inner diameter $D_H$ of the holder 10 is substantially equal to a diameter $D_L$ of the optical component 30. That is, the size of the lens disposed in the holder 10 may be identical to the inner space of the holder 10.

Figure 5:
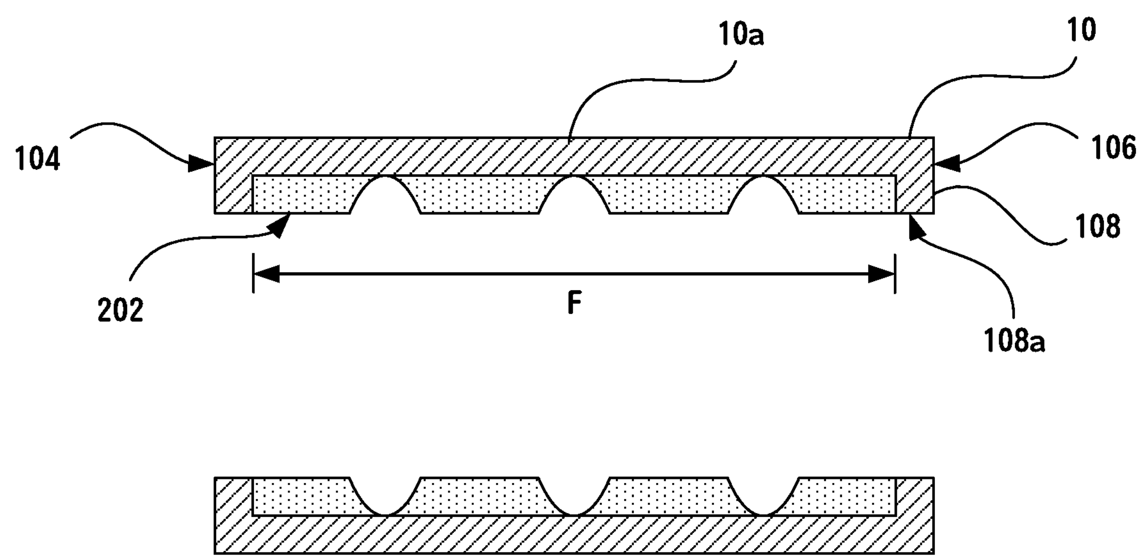
FIG. 5 illustrates a cross-sectional view of a holder and an elastic damper layer according to some embodiments of the present disclosure.

Referring to FIG. 5, in some embodiments, the holder 10 includes at least a protrusion 108 on the inner surface 102. The protrusion 108 is integrated with a main body 10*a* of the holder 10 and the material of the protrusion 108 is identical to the main body 10*a*. In some embodiments, the protrusions 108 are at the inlet end 104 and the outlet end 106 of the holder 10 and thus encloses an area F for disposing the elastic damper layer 20. In some embodiments, the thicknesses of the protrusions 108 are consistent with each other. In some embodiments, the thickness of the elastic damper layer 20 is less than or identical to the thickness of the protrusion 108. In some embodiments, the top surface 108*a* of the protrusion 108 is substantially coplanar with the first surface 202 of the elastic damper layer 20, therefore a light path of the holder 10 may not be blocked or affected by the elastic damper layer 20.

Figure 6:
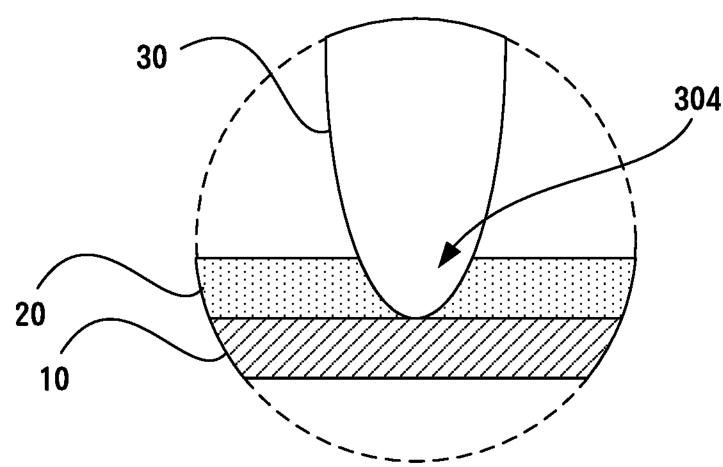
FIG. 6 illustrates a cross-sectional view of an enlarged optical component and an elastic damper layer according to some embodiments of the present disclosure.

In the present disclosure, the weight of the optical component 30 is borne by the holder 10, and the elastic damper layer 20 may devise the optical component 30 at an adequate position on the inner surface 102 of the holder 10. Referring to FIG. 6, in some embodiments, an edge portion 304 of the optical component 30 is laterally surrounded by the elastic damper layer 20, thus the optical component 30 may not be laterally displaced in the holder 10. In some embodiments, the thickness of the elastic damper layer 20 is not only less than or identical to the thickness of the protrusion 108 as foregoing mentioned, but also not less than half of the thickness of the protrusion 108 in order to provide enough resisting capacity to lateral force generated by vibration.

Figure 7:
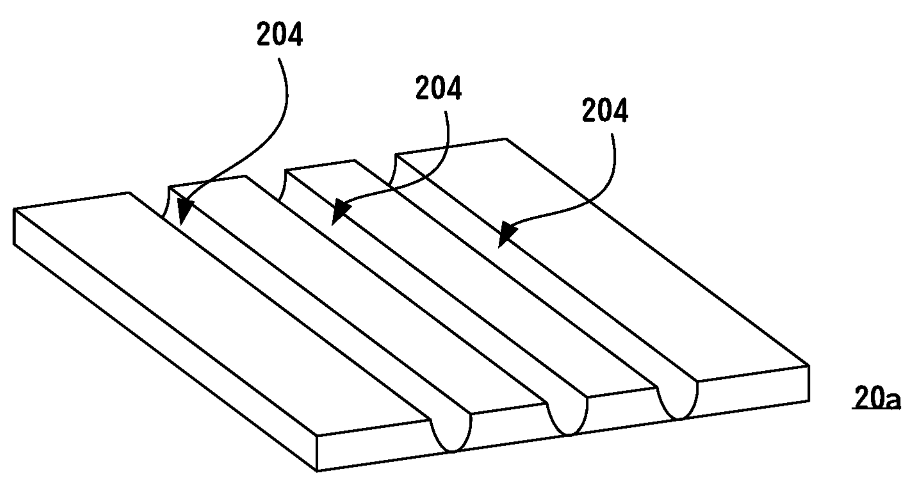
FIG. 7 illustrates a spread elastic damper layer according to some embodiments of the present disclosure.

Referring to FIG. 7, in some embodiments of the present disclosure, the vibration absorption material in the holder may have a film structure 20*a* with multiple trenches 204 for the optical components engaged therewith. Such film structure 20*a* may be manufactured by forming the trenches on a smooth surface of an unprocessed film, and then the processed film is spread on the inner surface of the holder. In some alternative embodiments of the present disclosure, the vibration absorption material in the holder may be separated as a plurality of units at the very beginning in the manufacturing process.

Figure 8A:
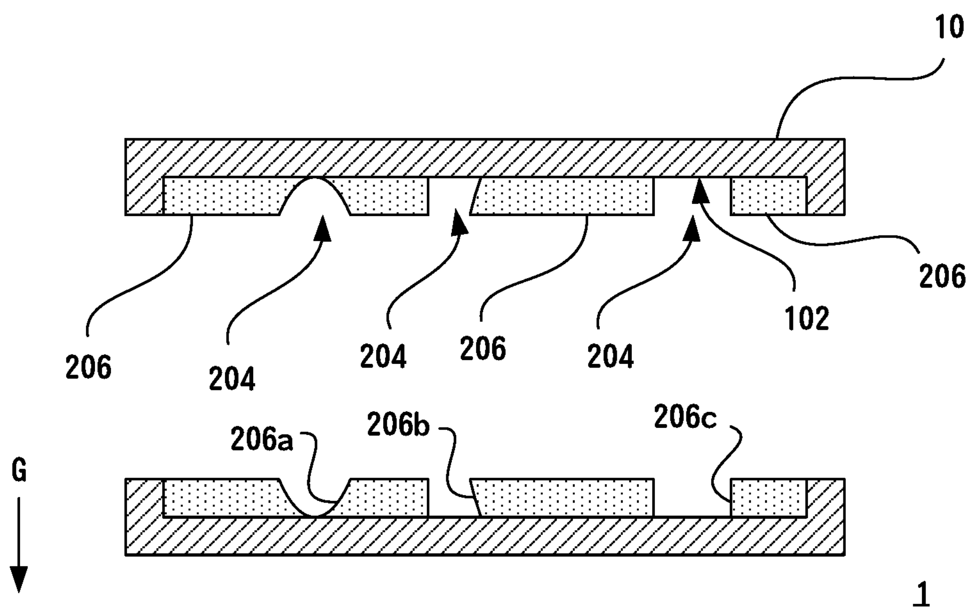
FIG. 8A illustrates a cross-sectional view of a holder and a plurality of elastic damper bulks according to some embodiments of the present disclosure.
Figure 8B:
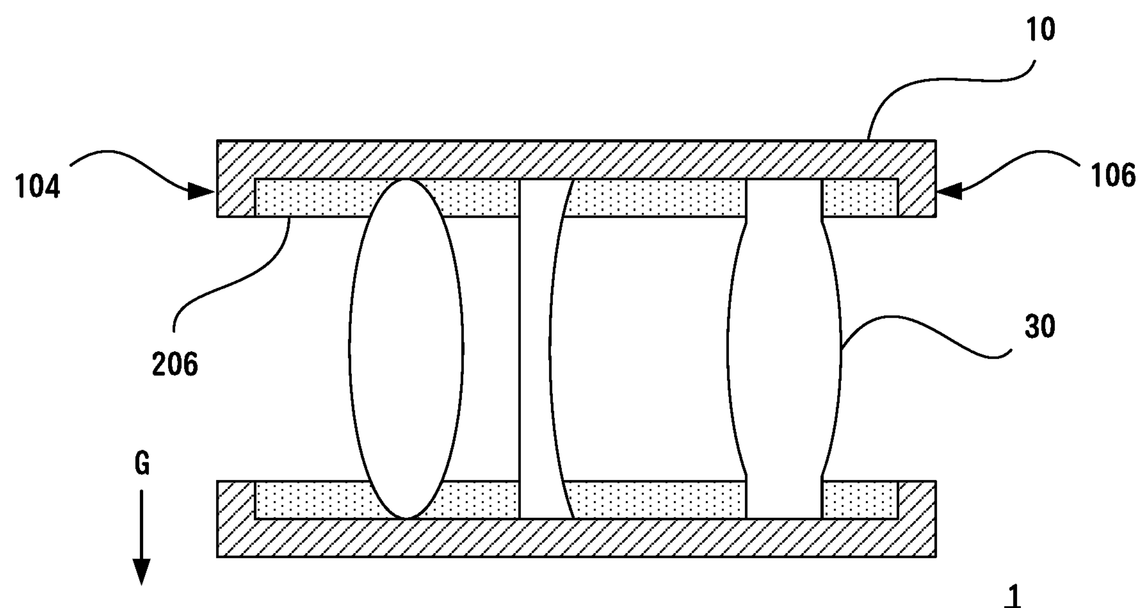
FIG. 8B illustrates a cross-sectional view of an optical module structure according to some embodiments of the present disclosure.

Referring to FIGS. 8A and 8B, in some embodiments, a plurality of elastic damper bulks 206 may be disposed at the inner surface 102 of the holder 10, and a plurality of optical components 30 may be disposed in the holder 10 by engaging with the plurality of elastic damper bulks 206. The elastic damper bulks 206 are vibration absorption units which may be made by rubber and the like, including natural rubber and synthetic rubber. The material for forming the elastic damper bulks 206 may be isobutylene isoprene rubber (IIR), thermoplastic rubber (TPR), ethylene propylene diene monomer (EPDM), chloroprene rubber (CR), hydrogenated nitrile rubber (NHBR) carboxylate nitrile rubber (XNBR), silicone rubber or high consistency rubber (HCR). In some embodiments, some of the polymers with vibration absorption ability are also available, such as polyurethane (PU) and thermoplastic polyurethane (TPU).

In some embodiments, each of the elastic damper bulks 206 may include a concave sidewall 206*a*, a convex sidewall 206*b*, or a vertical sidewall 206*c*. The curvature of the concave sidewall 206*a* may correspond to the curvature of an adjacent biconvex lens, plano-convex lens, positive meniscus lens, or negative meniscus lens. The convex sidewall 206*b* may correspond to the curvature of an adjacent positive meniscus lens, negative meniscus lens, plano-concave lens, or biconcave lens. The vertical sidewall 206*c* may against the plain surface of an adjacent plano-convex lens, plano-concave lens, or optical components with vertical sidewall. The elastic damper bulks 206 may be manufactured and disposed in the holder individually. For instance, the elastic damper bulks 206 and the optical components 30 may be arranged along a direction perpendicular to the direction of gravity G alternatively, that is, the elastic damper bulks 206 and the optical components 30 may be arranged from the inlet end 104 or the outlet end 106 of the holder 10 one by one, and vice versa.

Figure 9:
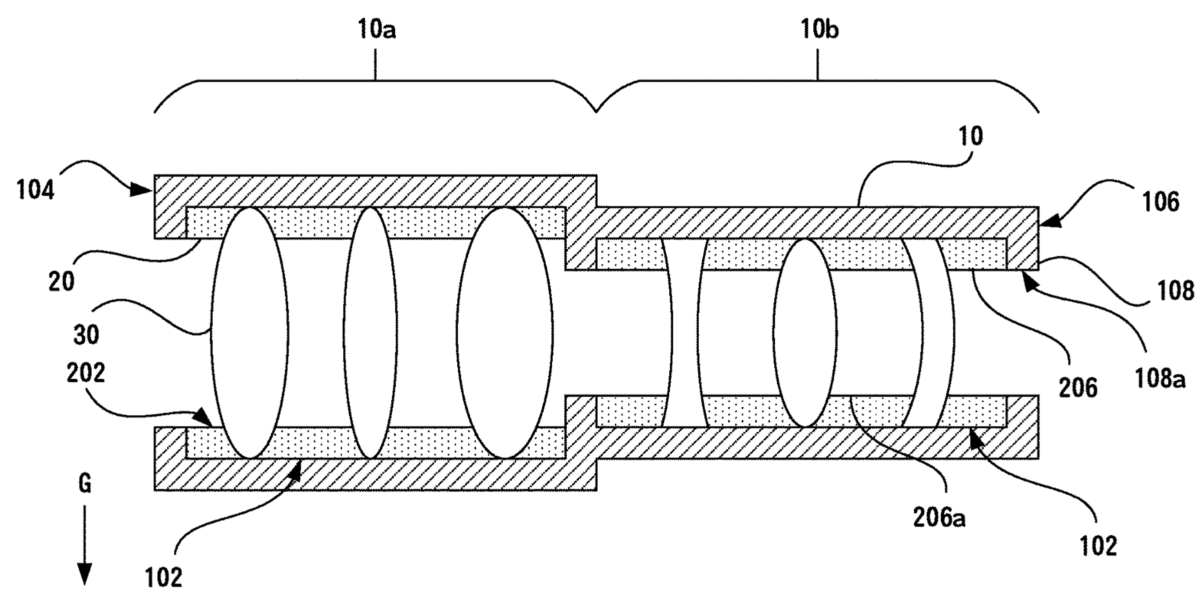
FIG. 9 illustrates a cross-sectional view of an optical module structure according to some embodiments of the present disclosure.

Referring to FIG. 9, in some embodiments, the holder 10 may be separated into a first section 10*a* and a second section 10*b*. In some embodiments, the diameter of the first section 10*a* is different from the diameter of the second section 10*b*. The connection of the first section 10*a* and the second section 10*b* can take various forms, for example, the first section 10*a* and the second section 10*b* may be integrated or be connected with screw connection. In some embodiments, the vibration absorption material in the first section 10*a* and the second section 10*b* may be used in different types. For example, there is an elastic damper layer 20 on the inner surface 102 at the first section 10*a*, whereas the inner surface 102 at the second section 10*b* has a plurality of elastic damper bulks 206 thereon as shown in the figure. Moreover, both of the thicknesses of the elastic damper layer 20 and the elastic damper bulks 206 are also not higher than the thickness of the protrusions 108 on the inner surface 102. In some embodiments, the first surface 202 of the elastic damper layer 20 or the top surface 206*a* of the elastic damper bulks 206 may coplanar with the top surface 108*a* of the protrusion 108 proximity to the inlet end 104 or the outlet end 106.

Figure 10:
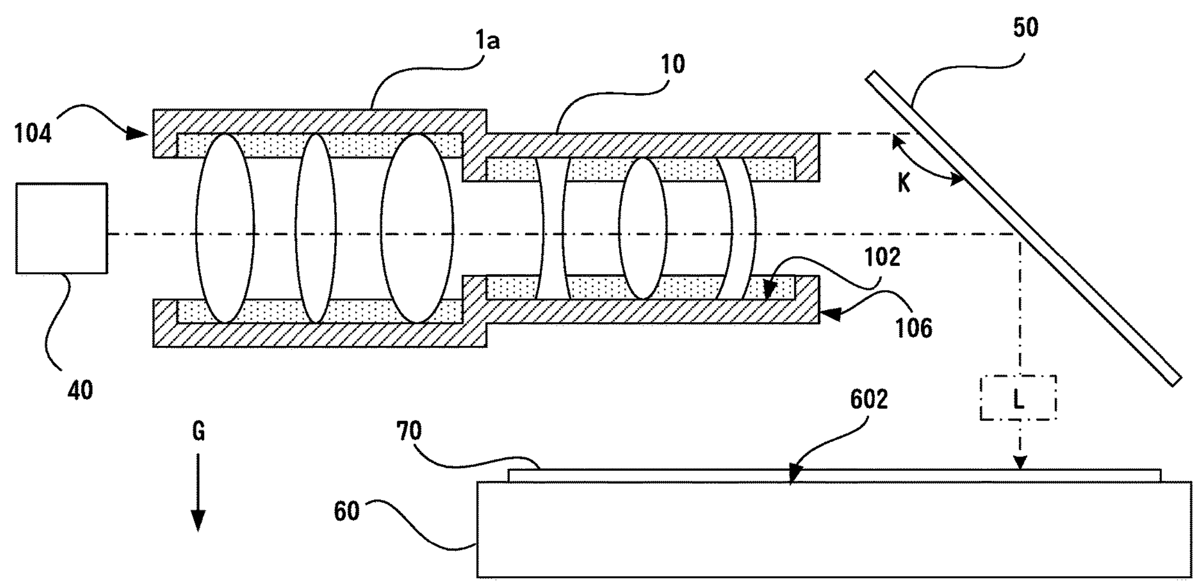
FIG. 10 illustrates a cross-sectional view of an optical system according to some embodiments of the present disclosure.

The optical module structure provided in the present disclosure may be used in an optical system. Referring to FIG. 10, in some embodiments, the optical system includes a light source 40, an optical module 1*a*, and a reflector 50. The light source 40 is disposed in proximity to an inlet end 104 of a holder 10 of the optical module 1*a*. The details of structure of the holder 10 may refer to previous shown FIG. 9. The light source 40 may provide a light L to the holder 10, such as laser. The reflector 50 is aligned with the optical module 1*a* and may change a direction of the light L. In some embodiments, when the optical module 1*a* and a target wafer 70 are arranged horizontally (i.e., an axial direction of the optical module 1*a* is perpendicular to a direction of gravity G), the direction of the light L propagating along the axial direction of the optical module 1*a* can be altered by a reflector 50 in front of an outlet end 106 of the holder 10. In some embodiments, an angle K between a horizontal extension of the holder 10 and the reflector 50 is about 135°, thereby the angle of reflection of the light L may be about 90°. The reflector 50 is made of a material which has a reflectivity of greater than 90%. In some embodiment, a thin silver film coated onto a thin glass film is suitable for making the reflector 50.

In some embodiments, the optical system includes a susceptor 60 at a lower stream of the reflector 50, wherein a top surface 602 of the susceptor 60 is parallel to the inner surface 102 of the holder 10. Accordingly, the target wafer 70 over the susceptor 60 is parallel to the inner surface 102 of the holder 10, and meanwhile, target wafer 70 is perpendicular to the light L. In some embodiments, the susceptor 60 may be a pedestal, a wafer chuck, and/or other suitable wafer holding apparatus.

Figure 11:
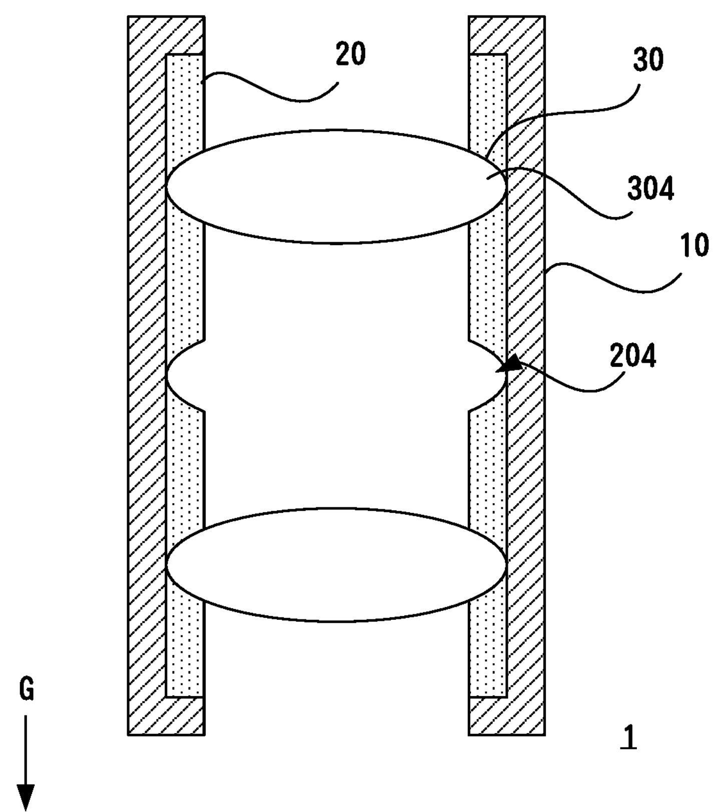
FIG. 11 illustrates a cross-sectional view of an optical module structure according to some embodiments of the present disclosure.

Referring to FIG. 11, in some embodiments, the holder 10 is set with a direction parallel to the direction of gravity G. under such configuration, because the optical components 30 inside the holder 10 are arranged along a direction parallel to the direction of gravity G, the weight of the optical components 30 is borne by the elastic damper layer 20 instead of the holder 10. In other words, the stableness of the optical components 30 depends on the features of the elastic damper layer 20. In some embodiments, the trenches 204 are U-shaped so that edge portions 304 of the optical components 30 may be engaged with the elastic damper layer 20 and the weight of the optical components 30 borne by the elastic damper layer 20.

In some embodiments, a width of the trench 204 at the first surface 202*a* is equal to or larger than a width of the optical component 30, in order to ensure the optical component 30 may be engaged with the elastic damper layer 20. In some embodiments, in consideration for the elasticity of the elastic damper layer 20, the size of the edge potion 304 of the optical component 30 may be larger than the size of the U-shaped trench 204 slightly, thus the elastic damper layer 20 may better support the edge potion 304 of the optical component 30 and therefore obtain better stableness of the optical component 30.

In the present disclosure, an optical module structure which rotates the direction of the optical components by 90° is provided. The purpose of the rotation is to use an outer shell of the optical module as a holder to bear the weight of a plurality of optical components in the optical module. In addition, the optical components are positioned by an elastic damper layer or a plurality of elastic damper bulks so that the optical components in the holder may not be displaced under vibration. In some alternative embodiments, the optical components arranged to align along the direction of gravity is provided. The elastic damper layer or the elastic damper bulks still may provide enough elasticity to hold the optical components. Based on the present disclosure, the optical module for alignment may avoid optics displacement, therefore the overlay accuracy may be enhanced.

In one exemplary aspect, an optical module structure is provided. The optical module structure includes: a holder, an elastic damper layer, and an optical component. The holder has an inner surface. The elastic damper layer is on the inner surface and has a trench at a first surface of the elastic damper layer. The optical component is engaged with the elastic damper layer through the trench.

In another exemplary aspect, an optical module structure is provided. The optical module structure includes: a holder, a plurality of elastic damper bulks, and a plurality of optical components. The holder has an inner surface. The elastic damper bulks are at the inner surface. The optical components are in the holder by engaging with the elastic damper bulks.

In yet another exemplary aspect, an optical system is provided. The optical system includes: a light source, an optical module, and a reflector. The light source is configured to provide a light. The optical module is aligned with the light source and configured to receive the light. The optical module includes a holder, an elastic damper layer, and a plurality of optical components. The holder has an inner surface. The elastic damper layer is on the inner surface of the holder and has a plurality of trenches at a first surface of the elastic damper layer. The optical components are engaged with the elastic damper layer through the trenches. The reflector is aligned with the optical module and configured to change a direction of the light. The optical components are arranged along a direction perpendicular to a direction of gravity.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An optical module structure, comprising:

a holder having an inner surface;

an elastic damper layer on the inner surface and having a trench at a first surface of the elastic damper layer; and an optical component engaged with the elastic damper layer through the trench, the optical component having a first optical surface and a second optical surface opposite to the first optical surface, and the first optical surface and the second optical surface are both in contact with the elastic damper layer.

2. The optical module structure of claim 1, wherein a thickness of the elastic damper layer at a bottom of the trench is about zero.

3. The optical module structure of claim 2, wherein the optical component is in contact with the inner surface of the holder.

4. The optical module structure of claim 1, wherein an inner diameter of the holder is substantially equal to a diameter of the optical component.

5. The optical module structure of claim 1, wherein the elastic damper layer is spaced between the optical component and the inner surface of the holder at a bottom of the trench.

6. The optical module structure of claim 1, wherein a material of the elastic damper layer comprises rubber.

7. The optical module structure of claim 2, wherein the holder further comprises a protrusion on the inner surface.

8. The optical module structure of claim 7, wherein a top surface of the protrusion is substantially coplanar with the first surface of the elastic damper layer.

9. An optical module structure, comprising:

a holder having an inner surface;

a plurality of elastic damper bulks at the inner surface; and a plurality of optical components in the holder by engaging with the plurality of elastic damper bulks, each of the optical components having a first optical surface and a second optical surface opposite to the first optical surface;

wherein an edge portion of each of the optical components is in contact with the inner surface of the holder, and the first optical surface and the second optical surface are in contact with the plurality of elastic damper bulks adjacent to the edge portion.

10. The optical module structure of claim 9, wherein the optical components comprise a concave lens and a convex lens.

11. The optical module structure of claim 9, wherein the optical components are arranged along a direction perpendicular to a direction of gravity.

12. The optical module structure of claim 9, wherein the holder further comprises a first section and a second section, and a diameter of the first section is different from a diameter of the second section.

13. The optical module structure of claim 9, wherein the elastic damper bulk comprises a concave sidewall or a convex sidewall.

14. An optical system, comprising:

a light source configured to provide a light;

an optical module aligned with the light source and configured to receive the light, comprising:

a holder having an inner surface;

an elastic damper layer on the inner surface of the holder and having a plurality of trenches at a first surface of the elastic damper layer; and a plurality of optical components engaged with the elastic damper layer through the trenches, each of the optical components having a first optical surface and a second optical surface opposite to the first optical surface, and the first optical surface and the second optical surface are both in contact with the elastic damper layer; and a reflector aligned with the optical module and configured to change a direction of the light;

wherein the optical components are arranged along a direction perpendicular to a direction of gravity.

15. The optical system of claim 14, wherein the optical component is spaced from the inner surface of the holder by the elastic damper layer.

16. The optical system of claim 14, wherein an angle between the holder and the reflector is about 135°.

17. The optical system of claim 14, wherein one of the trenches engaged with the optical component is U-shaped and having an opening facing an inner side of the holder from a cross-sectional view.

18. The optical system of claim 14, wherein a material of the elastic damper layer is isobutylene isoprene rubber.

19. The optical system of claim 14, further comprising a susceptor at a lower stream of the reflector, wherein a top surface of the susceptor is parallel to the inner surface of the holder.

20. The optical system of claim 14, wherein the light source comprises laser.

* * * * *